United States Patent
Campini et al.

(10) Patent No.: US 7,133,287 B2
(45) Date of Patent: Nov. 7, 2006

(54) ATCA INTEGRATED HEATSINK AND CORE POWER DISTRIBUTION MECHANISM

(75) Inventors: Edoardo Campini, Mesa, AZ (US); William F. Handley, Chandler, AZ (US); Mark D. Summers, Phoenix, AZ (US); Javier Leija, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 10/813,931

(22) Filed: Mar. 31, 2004

(65) Prior Publication Data

US 2005/0219825 A1 Oct. 6, 2005

(51) Int. Cl.
*H05K 7/20* (2006.01)
*F28F 7/00* (2006.01)
*H02G 5/10* (2006.01)
*H01L 23/34* (2006.01)
*H01L 23/52* (2006.01)

(52) U.S. Cl. ............... 361/719; 361/775; 361/704; 165/80.3; 174/16.1; 174/16.2; 174/16.3; 257/712; 257/713; 257/719; 257/691

(58) Field of Classification Search ............ 361/775, 361/794, 719–721, 210, 690, 746
See application file for complete search history.

(56) References Cited

U.S. PATENT DOCUMENTS 6,088,227 A * 7/2000 Bujtas et al. ............ 361/719
6,137,709 A * 10/2000 Boaz et al. ............ 365/51
6,160,707 A * 12/2000 Yin ............ 361/704
6,304,437 B1 * 10/2001 Foo et al. ............ 361/683
6,520,805 B1 * 2/2003 Hassanzadeh et al. ...... 439/633
6,606,246 B1 * 8/2003 Wells ............ 361/719

OTHER PUBLICATIONS

Advanced TCA, "PICMG 3.0 Short Form Specification", PICMG PCI Industrial Computers, Jan. 2003, pp. 1-33.
http://www.cheresources.com.htpipes.shtml, ChEPlus, downloaded Mar. 26, 2004.

* cited by examiner

*Primary Examiner*—Lisa Lea-Edmonds
*Assistant Examiner*—Zachary Pape
(74) *Attorney, Agent, or Firm*—Blakely, Sokoloff, Taylor & Zafman LLP

(57) ABSTRACT

An integrated heatsink and core power distribution mechanism. First and second power rails are disposed on opposite sides of one of more integrated circuits on a printed circuit board (PCB). The power rails are electrically coupled to a power supply and the integrated circuits. At the same time, the power rails are used to thermally couple one or more heatsinks to the integrated circuit(s). Each power rails includes at least one slot configured to receive a flange on the heatsink(s). In situations under which different voltages are supplied via the power rails, means are provided to electrically insulate at least one power rail from the heatsink(s) while maintaining thermal coupling to the power rails. In one embodiment, a split-rail configuration is used, wherein the power rail includes multiple conductive sections separated by one or more insulator sections. The scheme is well-suited for modular board/blade architectures, such as the Advanced Telecommunications Architecture (ATCA).

29 Claims, 8 Drawing Sheets

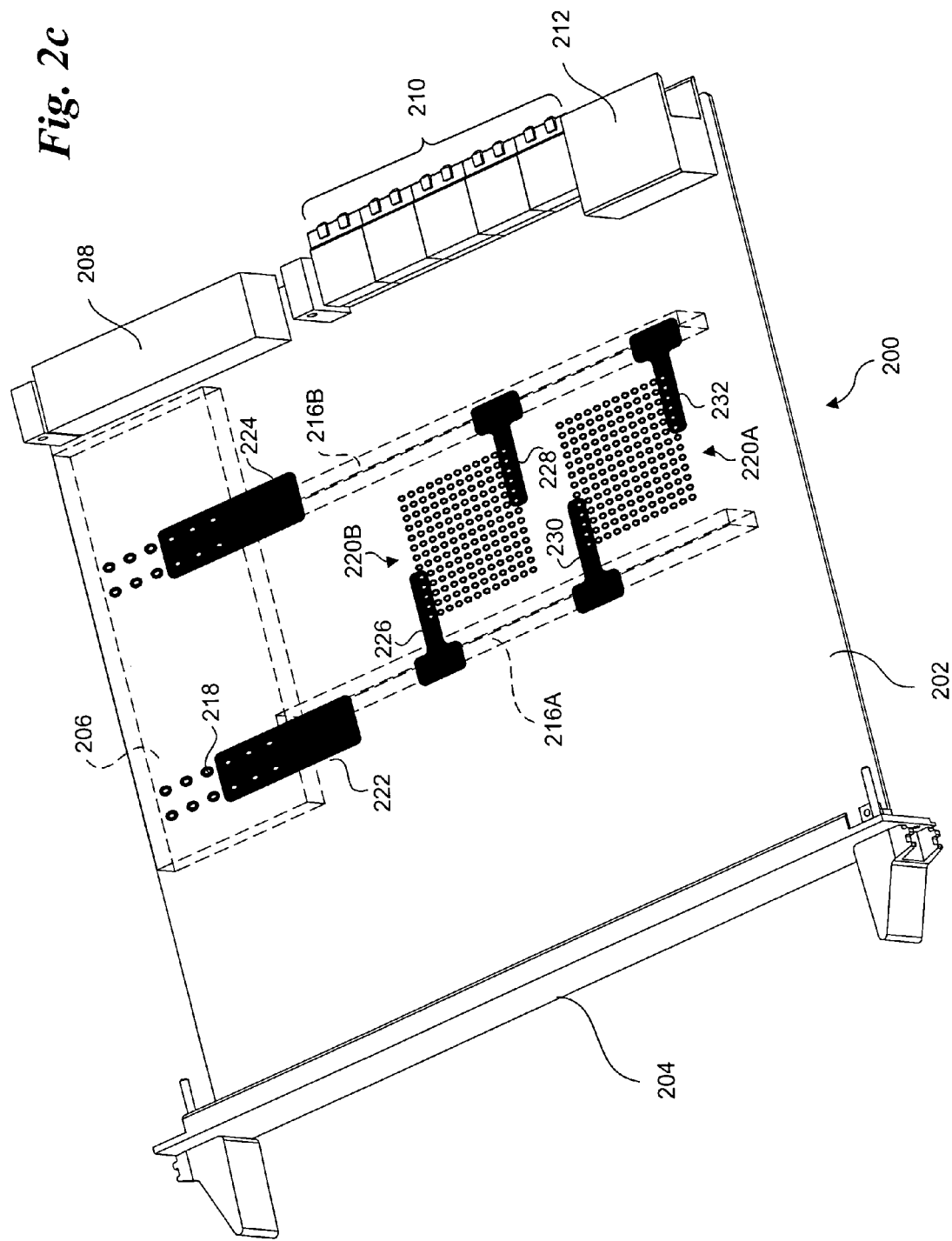

ATCA INTEGRATED HEATSINK AND CORE POWER DISTRIBUTION MECHANISM

FIELD OF THE INVENTION

The field of invention relates generally to computer and telecommunications equipment, and, more specifically but not exclusively relates to an integrated heatsink and core power distribution mechanisms for computer and telecommunication equipment boards.

BACKGROUND INFORMATION

During the 1990's the telecommunications market experienced two extremely favorable market factors of quickly increasing bandwidth requirements combined with fast market growth. While these factors were great for the industry, they led to a hodgepodge of proprietary standards designed to meet the immediate market needs that each company was working to service. Despite the advent of the highly successful Compact PCI (peripheral component interconnect) standard, the fact remains that the majority of the telecommunications market has no standard form factor, backplane or fabric interconnect that can meet the 10 Gb/sec+ bandwidth requirements of today. There continues to be tens, if not hundreds, of different chassis designs in the telecommunication industry, which drives the cost of this equipment higher, while preventing multi-sourcing and interoperability across a common backplane or fabric.

Significant changes in the telecommunications market have occurred in the last few years, resulting in a leveling off of the meteoric growth of the 1990's, with competition increasing accordingly. In today's cost-cutting environment of constrained budgets, it is more important than ever for telecommunications equipment providers to leverage off-the-shelf components and sub-systems, thereby minimizing investment and maximizing the breadth of product environment.

In view of the foregoing, as well as other considerations, various industry efforts have been directed to defining a standardized, modular telecommunications equipment solution. A leading standard resulting from one of these endeavors is the Advanced Telecommunications Architecture (ATCA) (also referred to as Advanced TCA). The ATCA standard defines an open switch fabric based platform delivering an industry standard high performance, fault tolerant, and scalable solution for next generation telecommunications and data center equipment. The development of the ATCA standard is being carried out within the PCI Industrial Computer Manufacturers Group (PICMG)—the same group that created the highly successful Compact PCI standard. The Advanced TCA 3.0 base specification defines the physical and electrical characteristics of an off-the-shelf, modular chassis based on switch fabric connections between hot-swappable blades. The Advanced TCA base specification supports multiple fabric connections, including the advanced switching (AS) standard.

The ATCA 3.0 base specification defines the frame (rack) and shelf (chassis) form factors, core backplane fabric connectivity, power, cooling, management interfaces, and the electromechanical specification of the ATCA-compliant boards. The electromechanical specification is based on the existing IEC60297 EuroCard form factor, and enables equipment from different vendors to be incorporated in a modular fashion and be guaranteed to operate.

The ATCA 3.0 base specification also defines a power budget of 200 Watts (W) per board, enabling high performance servers with multi-processor architectures and multi gigabytes of on-board memory. The framepower is delivered by redundant −48 VDC feeds. These dual framepower feeds are typically fused and multiple sub-feeds are generated, allowing each shelf to remain electrically isolated. Local DC—DC conversion is accomplished per board. Redundant local power feeds are normally attached through either diode Or'ed connections to a single on-board DC—DC converter or via on-board dual redundant load sharing DC—DC converters.

The PICMG organization has performed extensive thermal modeling in order to design the ATCA board and shelf form factors to be able to support 200 W power dissipation per board slot. In a typical implementation, the shelf uses conventional air cooling, with blowers pulling air from front to rear and bottom to top. Mechanical fans are typically the element with the lowest MTBF (mean time between failure), and thus thermal designs should incorporate sufficient overhead to accommodate a failed blower. Blowers may be synchronized and include temperature controlled airflow to reduce audible levels.

Although the ATCA standard is a step in the right direction, several of its design aspects are limiting. Notably, the 200 W power dissipation per board slot places a restriction on how much heat can be generated by a board, while not defining the location of the heat sources. (It is noted the 200 W limit applies to boards occupying a single slot. Higher power dissipations are allowed for boards occupying multiple slots, e.g., a front board occupying two slots is limited to 400 W). In order to meet ever increasing bandwidth demand, equipment capabilities need to increase, requiring faster processors, among other board component improvements. When considering identical semiconductor fabrication processes, there is a direct relationship between speed and power consumption—the faster the processor speed, the greater the power consumption of the processor, and thus the greater the amount of heat that must be dissipated by an ATCA board hosting the processor. In view of the rigid board and shelf form factors defined by the ATCA base specification, this leads to problems in achieving sufficient cooling for high-power components such as processors, since the majority of the 200 W will be consumed by such components. Power routing on the boards is also problematic.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 2c is an isometric view showing further details of power pads, power supply pads, and IC (integrated circuit) pads formed in the printed circuit board (PCB) of the ATCA Front Board of FIG. 2a, according to one embodiment of the invention;

DETAILED DESCRIPTION OF PREFERRED EMBODIMENTS

Embodiments of apparatus and methods employing integrated heatsink and core power distribution mechanisms are described herein. In the following description, numerous specific details are set forth, such as implementations corresponding to the ATCA standard, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the following paragraphs, exemplary embodiments of the invention are described within a use context targeted to ATCA equipment installations. However, this does not limit the use of the principles and teachings disclosed herein to ATCA equipment. Rather, the following embodiments are merely illustrative of one possible type of installation. In general, the principles and teachings are applicable to various types of modular electronic equipment, including, but not limited to, telecommunications equipment and computer equipment.

The majority of equipment installed in central office and data centers today is air cooled due to simplicity, relatively low cost, ease of implementation, and reliability. This trend is likely to continue into the future for the same reasons. Accordingly, the thermal guidelines defined in the ATCA specification apply to air cooling; other cooling methods are permissible, but are not covered in the specification. In general, Boards, Shelves, and Frames may be either cooled by natural convection, without the assistance of fans or blowers, or cooled by forced convection with the assistance of fans or blowers. The choice is left to the end-user requirements.

Figure 1:
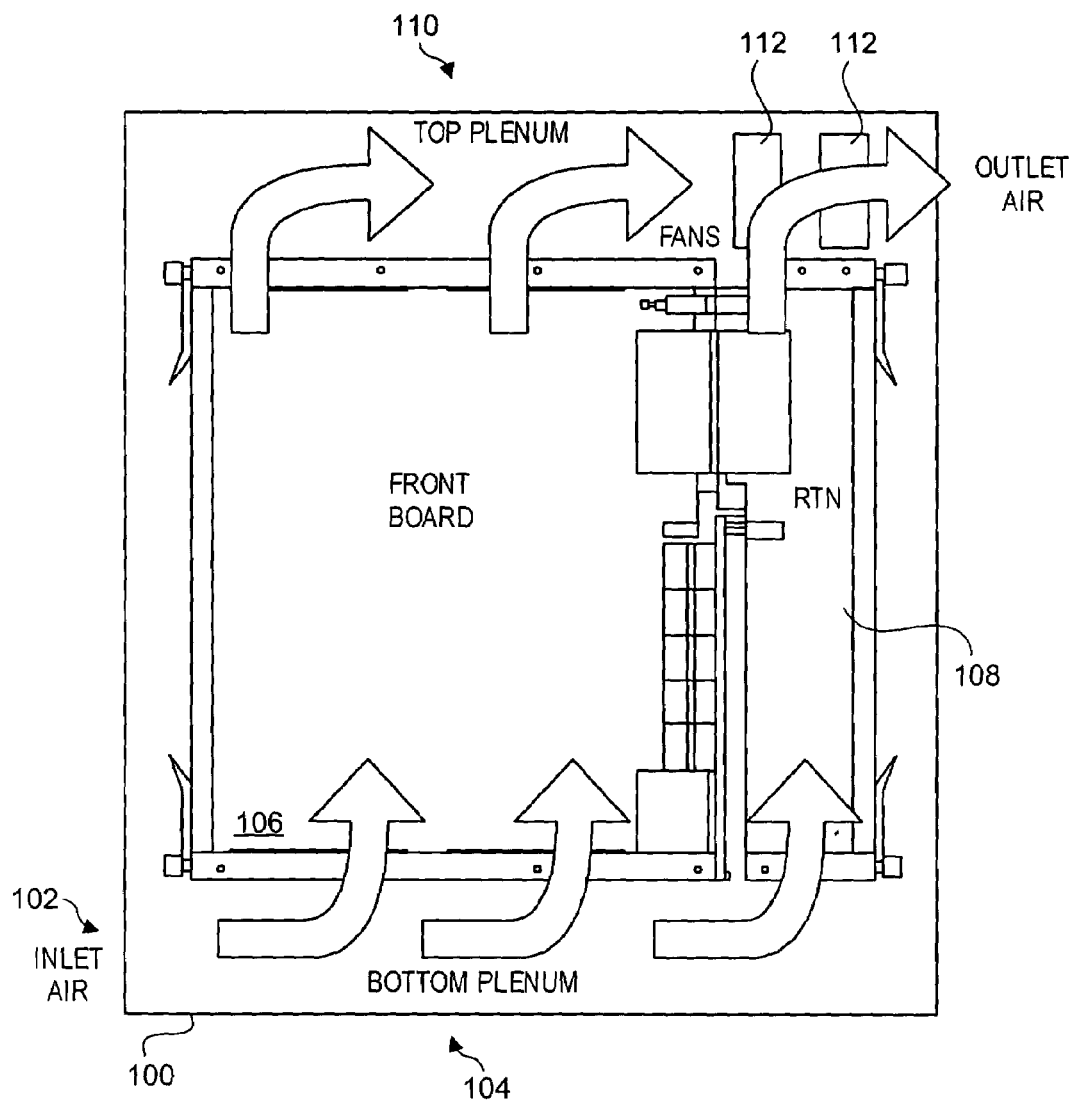
FIG. 1 is a schematic diagram of an exemplary airflow pattern defined by the ATCA (Advanced Telecommunication Architecture) standard for cooling ATCA boards.

An airflow path used as an example in the ACTA PICMG 3.0 Short Form Specification (January, 2003) is shown in FIG. 1. Air enters a Shelf 100 at in air inlet 102 at the lower front into a bottom plenum 104 and turns 90 degrees upward. Airflow across the bottom edge of a Front Board 106 and a rear transition module (RTM) 108 is evenly distributed. As the air passes across the hot components on Front Board 106 and RTM 108, heat is carried away by forced convection. The air exits the subrack at the top, is drawn into an upper plenum 110, turns 90 degrees, and is exhausted out the rear of Shelf 100 by fans 112. In addition to the illustrated configuration, other airflow paths and cooling methods are allowed under the ACTA standard.

In accordance with aspects of the embodiments described herein, enhanced cooling is facilitated through use of a pair of power rails, which are used to assist in removing heat from high power components, such as processors and the like. Furthermore, the power rails also function as buss bars to supply low voltage, high current electrical power to the high-power components being cooled.

Figure 2A:
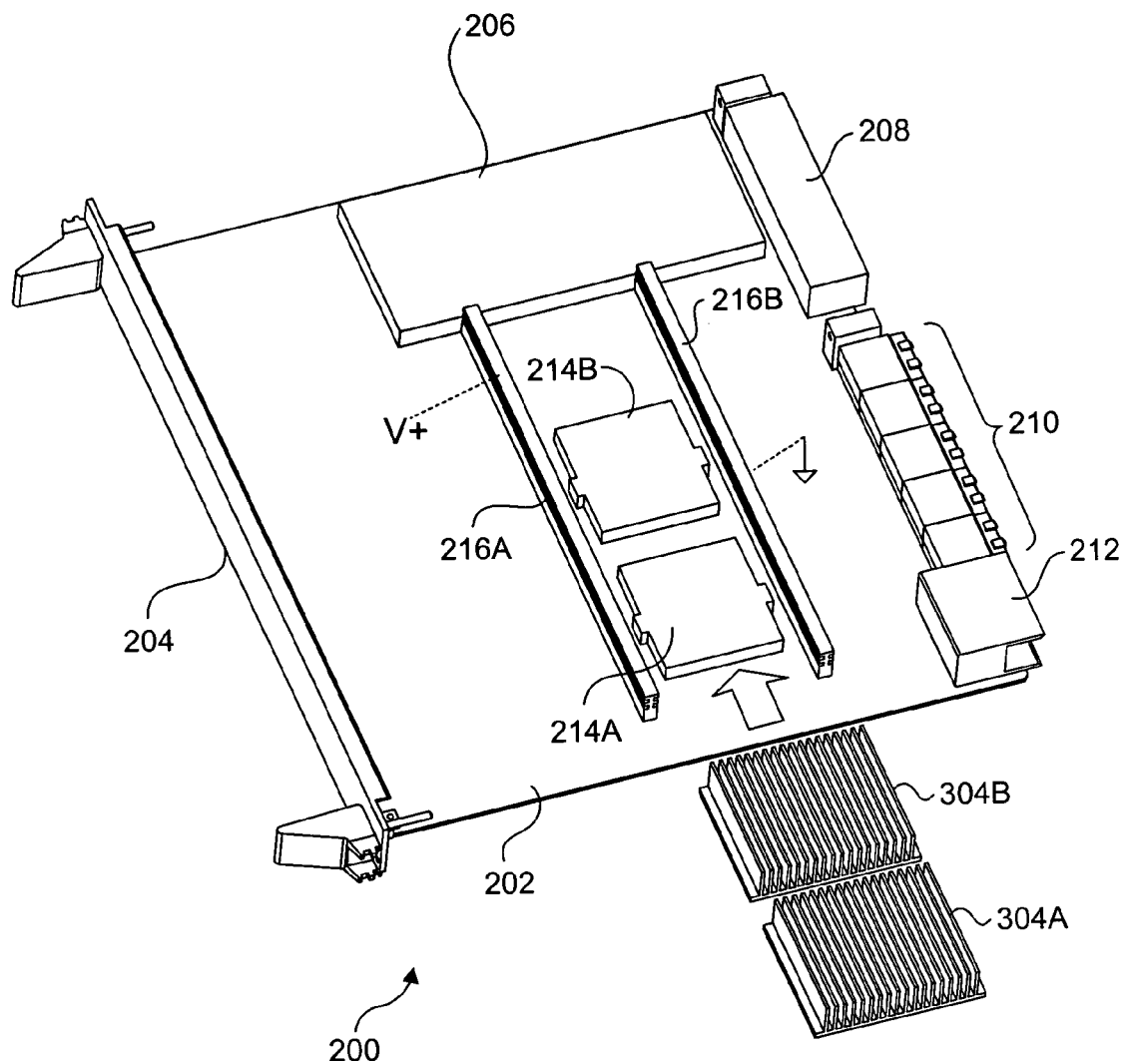
FIG. 2a is an isometric view of an ATCA Front Board including first and second power rails that are employed to provide power to first and second processors while simultaneously providing a mounting mechanism to thermally couple first and second heatsinks to the first and second processors, according to one embodiment of the invention.
Figure 2B:
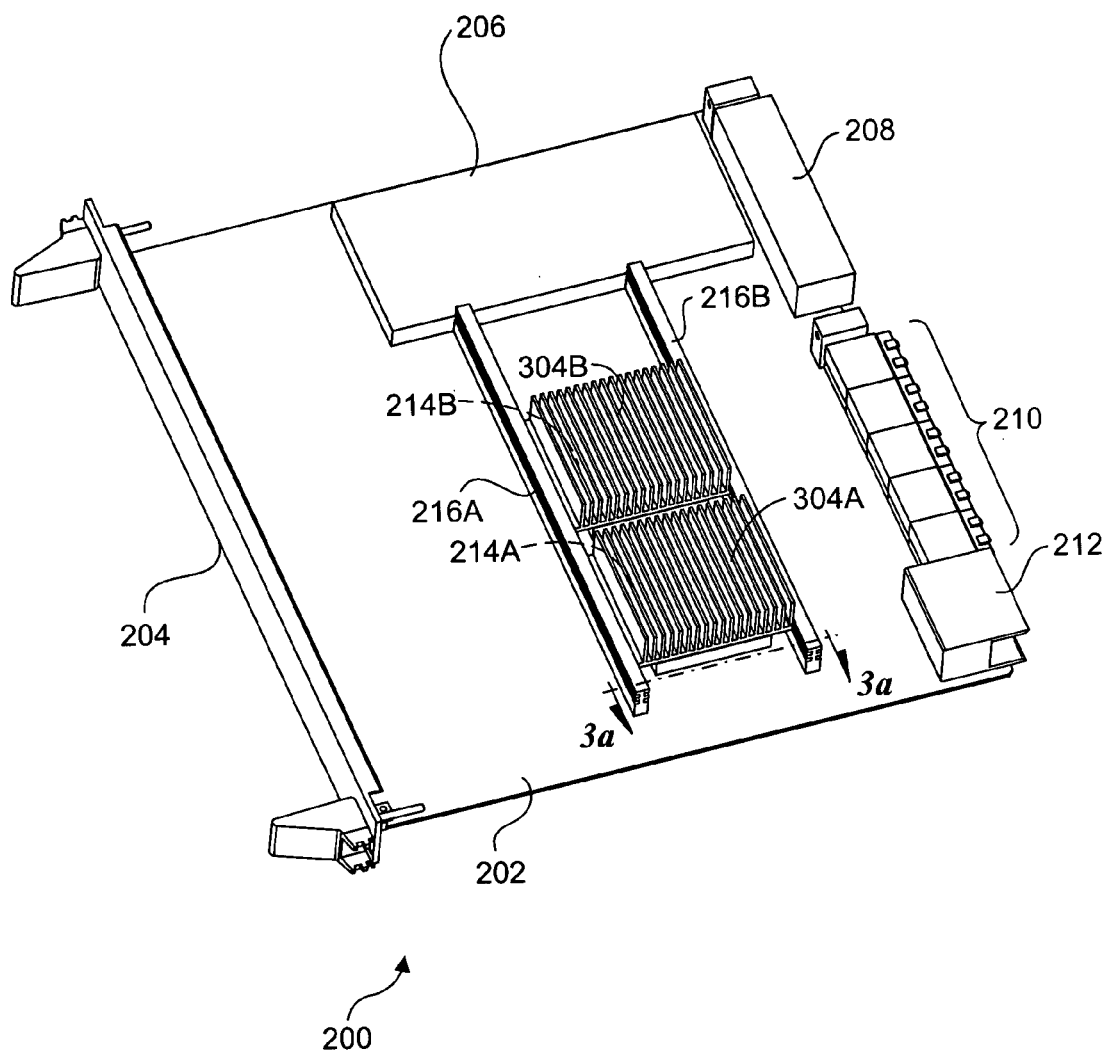
FIG. 2b is an isometric view of the ATCA Front Board embodiment of FIG. 2a showing the configuration of the heatsinks after assembly.
Figure 2D:
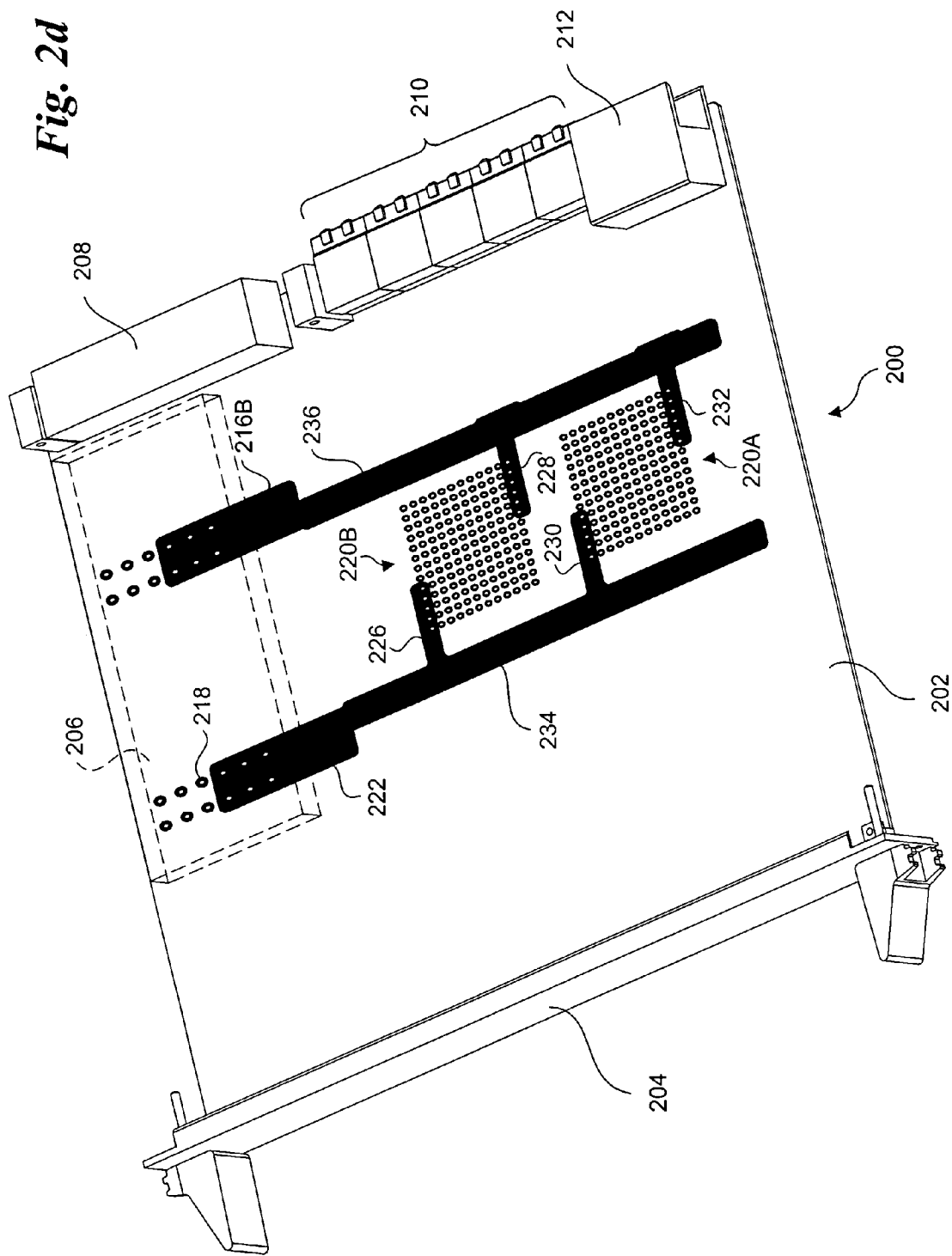
FIG. 2d is an isometric view showing further details of an alternative configuration for power pads formed in the PCB of the ATCA Front Board of FIGS. 2a–b, according to one embodiment of the invention.
Figure 2E:
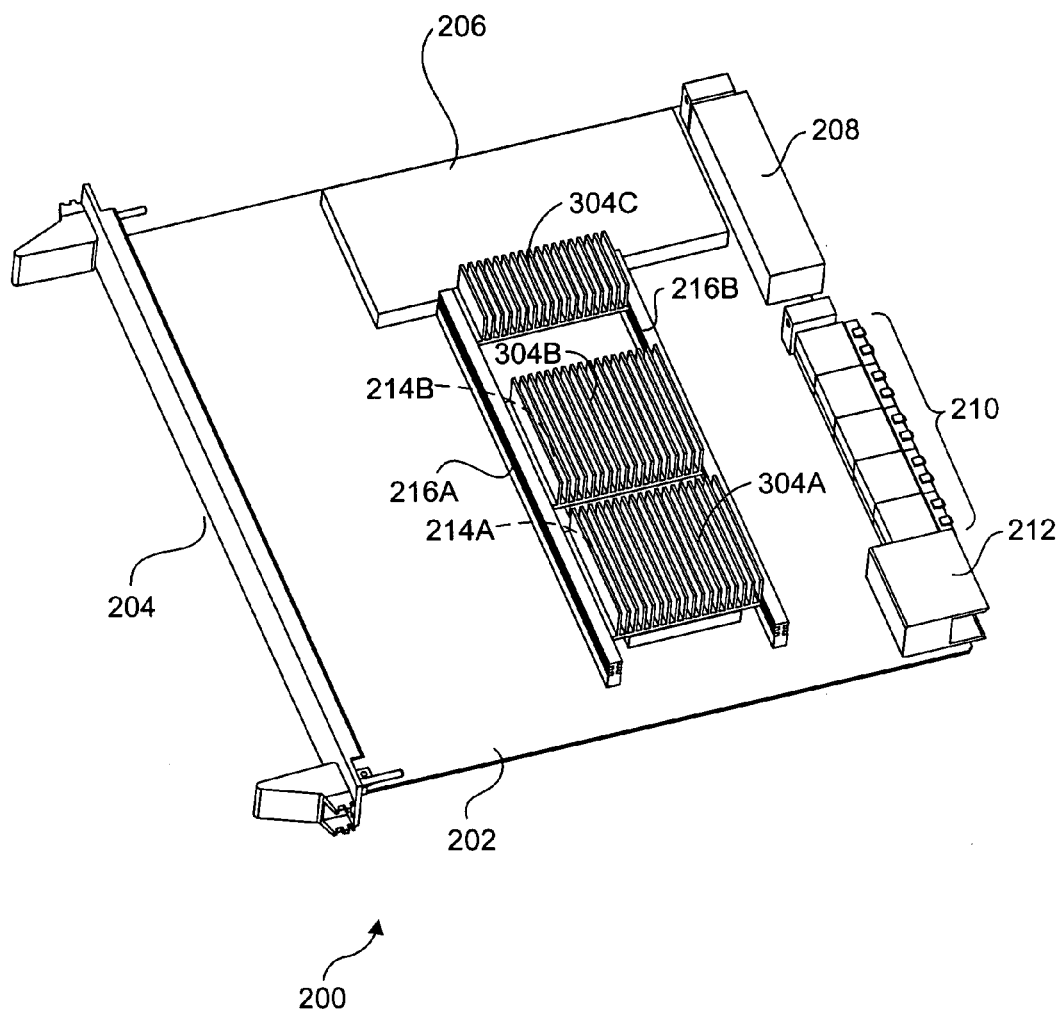
FIG. 2e is an isometric view showing a variation of the configuration of the ATCA Front Board embodiment of FIGS. 2a–b, wherein an additional heat sink is disposed toward the top of the first and second power rails.
Figure 2F:
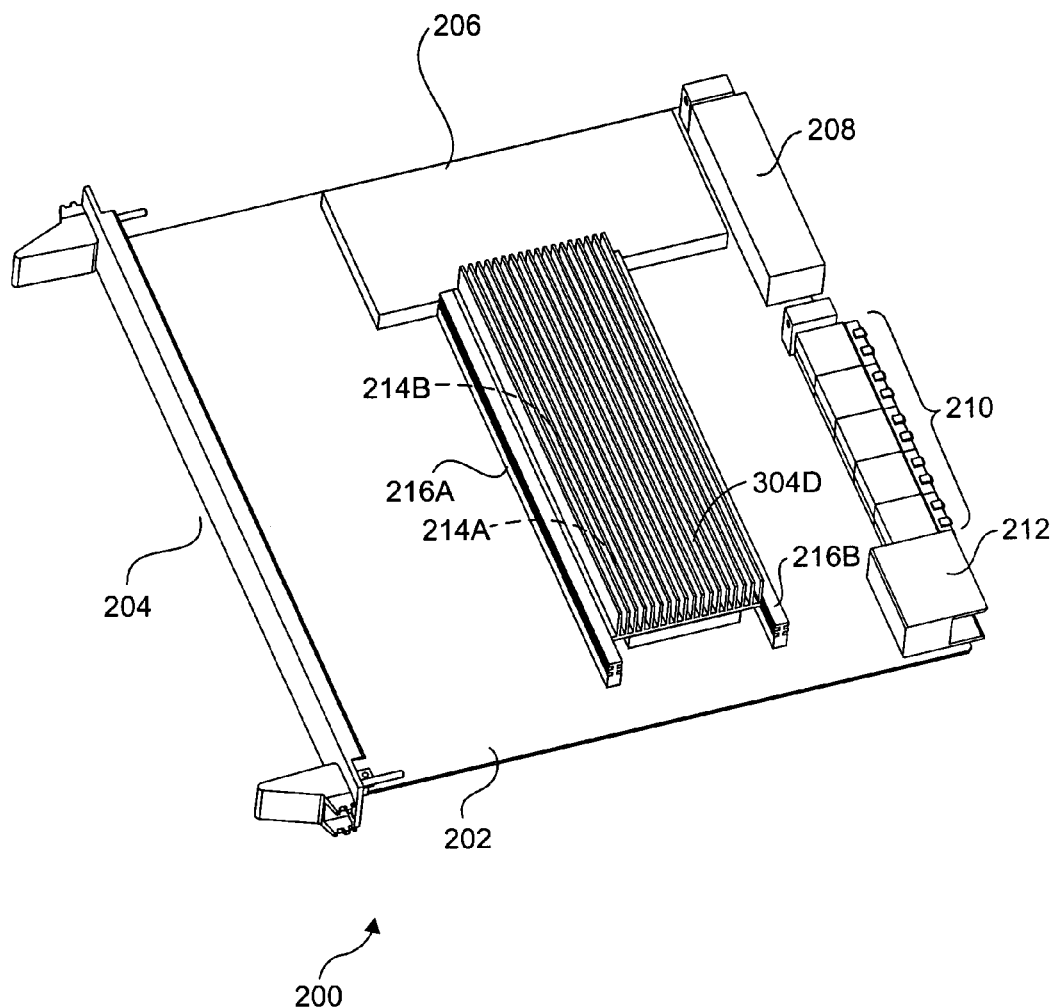
FIG. 2f is an isometric view showing a variation of the configuration of the embodiment of FIGS. 2a–b, wherein a single elongated heat sink is used.
Figure 3A:
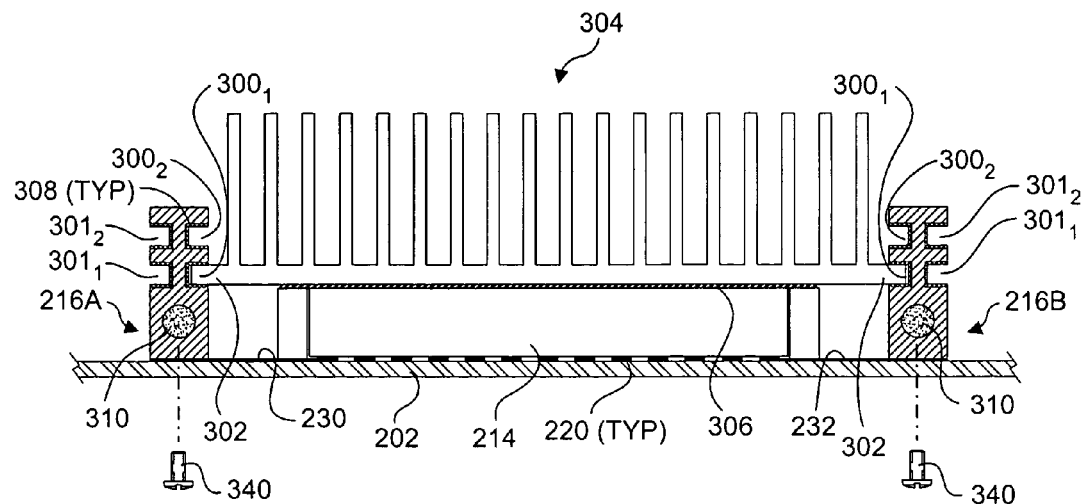
FIG. 3a is a cross-sectional view taken along line 3a—3a of FIG. 2b, illustrating further details of the first and second power rails, according to one embodiment of the invention.

One exemplary embodiment of this scheme is shown in FIGS. 2a, 2b, and 3a. Each of FIGS. 2a–f show a Front Board 200 comprising a printed circuit board 202 having a front panel 204 coupled thereto. Various components are coupled to or otherwise mounted on PCB 202, including a power module 206 disposed toward the top of PCB 202 and connectors 208, 210, and 212.

In general, the power module 206 includes one or more DC—DC converters, which convert input power (typically −48 V DC) to appropriate voltage levels to supply power at those voltage levels to various selected board components. (The internal details of the power module are not shown herein for clarity—techniques for designing and implementing power supplies of this type are well-known in the art; accordingly, further details are not discussed herein). These components include a pair of processors 214A and 214B. Other components powered by power module 206 are not shown here for clarity. In general, processors 214A and 214B may be coupled to Front Board 200 using one of several conventional mounting schemes, including soldering directly to a set of pads on a top layer of Front Board 200 or using a socket-type connections, wherein a mating socket is mounted to a set of drill-through pads (typically).

The embodiment of FIGS. 2a–b and 3a is designed to be used for any conventional type of integrated circuit (IC), such as, but not limited to, a microprocessor, a network processor, an application specific integrated circuit (ASIC), a field-programmable gate array (FPGA), a microcontroller, etc. Furthermore, the IC's packaging includes, but is not limited to, a Pin Grid Array (PGA) and a Ball Grid Array (BGA). As such, each of these types of IC's includes one or more pins (for PGA's) or solder pads (for BGA) to which power is supplied to make the IC operate.

Under a conventional PCB configuration, power is usually supplied via power traces defined in one or more layers of the PCB. In some instances, an entire layer is (substantially) used for power routing (e.g., for routing a primary positive voltage or ground). These layers are referred to as power planes and ground planes, respectively. Under other common configurations, traces supplying positive voltages and functioning as grounds may be provided within the same layer, while being separated by an appropriate insulator, such as the PCB substrate material. The power traces eventually are coupled to specific pads that are used to either directly connect to power pins or solder balls on the IC, or to socket pins that are internally connected to such power pins. This is done through various routing layers and vias, as is well-known in the PCB art.

One disadvantage with using power planes for high-power boards is that the amount of area occupied by the power traces tends to get large, increasing routing complexities for other board components and increasing heat due to resistive electrical losses. This problem is especially noticed when supplying power to low voltage, high current components, such as modern processors. For example, the core voltage of many of today's processors is only 2.0 volts or less (e.g., 1.0–1.5 volts). Thus, at 1.0 volts, a processor that is rated at 100 Watts would consume 100 amps of current when operating at its peak power rating. When multiple processors of this type are employed, the problem becomes even more pronounced.

In the embodiments of FIGS. 2a–f, as well as other embodiments described herein, the foregoing power routing problem is address by employing power "rails" that function as buss bars. The power rails have a relatively large cross-section (when compared with conventional power traces or power planes), leading to a dramatic reduction in heat generated from resistive losses. Furthermore, the power rails provided a convenient means for providing power to various board components, and significantly reduce routing real estate.

As shown in FIGS. 2a and 2b, first and second power rails 216A and 216B are used to supply power to processors 214A and 214B, wherein the power rails function as buss bars. In essence, each power rail performs a similar function to a power trace defined in a layer of PCB 202, except with much lower resistance due to the dramatically-increased cross section of a power rail when compare with a PCB trace. Accordingly, there needs to be a mechanism for electrically coupling one or more pads corresponding to pins (or solder balls) on an IC to which power at a give voltage is to be provided with by a corresponding power rail (or portion of a split power rails, as described below in further detail) with that power rail.

An exemplary power, IC, and power supply pad layout according to one embodiment is shown in FIG. 2c. As is well-known, pads are used to mechanically and electrically coupled surface-mounted components to PCBs by using an appropriate soldering technique. Drill-through pads may be used for coupling components with "pinned" packaging, while non-drilled pads are used for components that use non-pinned packaging, such as solder-ball coupling techniques. For illustrative purposes, all of the pads shown in FIGS. 2c and 2d are drill-through pads. However, any type of pad may be used, depending on the corresponding component that is to be mounted to the PCB.

Accordingly, FIGS. 2c and 2d show various pads used to couple corresponding components to PCB 202, including a set of power supply pads 218 and sets of IC pads 220A and 220B. Power supply pads are illustrative of pads used to couple power supply components to PCB 202. In general, power module 206 is illustrative of a power supply used to supply power to the various components of Front Board 200. In addition to the monolithic power brick configuration illustrated in FIGS. 2a and 2b, the power supply may comprise individual components mounted or otherwise coupled to PCB 202. These components will typically include DC—DC converters and various power-conditioning circuitry. The power supply circuitry will also include various forms of fusing and/or employ other isolation and circuit protection mechanisms to prevent damage to Front Board 200.

Under the PICMG 3.0 specification, each board is supplied with dual −48 VDC feeds. Each feed remains isolated and is fed individually to each board slot through the backplane. There are two basic methods for combining the dual redundant feeds. One method combines the two feeds through diode OR'ing and delivers the combined single feed to DC—DC converters. If either feed fails, all power shall be delivered by the surviving feed. The second method is to direct each of the two feeds to its own DC—DC converter. The outputs of the converters are then combined to provide power to the rest of the power supply circuits.

Under some embodiments, power module 206 is illustrative of a power supply comprising a field replaceable unit (FRU). Accordingly, an appropriate connector or set of connectors is/are coupled to PCB 202 to enable power module 206 to electrically couple to the PCB via a mating set of power supply pads, such as depicted by power supply pads 218.

IC pads 220A and 220B are illustrative of pads used to couple processors 214A and 214B to PCB 202. These sets of pads are used to couple electrical power and signals to an IC that is either directly coupled to the set of IC pads or is coupled to a socket connector or the like that is directly coupled to the set of IC pads.

In order to supply power to processors 214A and 214B, there needs to be a mechanism for routing power to selected pads from among IC pads 220A and 220B. In the embodiment of FIG. 2c, this is facilitated by power pads 222, 224, 226, 228, 230, and 232. As illustrated, power pads 220 and 224 are used to connect selected power supply pads 218 to power rails 216A and 216B, respectively (shown in hidden lines). Also as shown, each of power pads 220 and 224 are formed in a top layer of PCB 202. Optionally, a portion of these power pads may be routed via an internal layer in the PCB. Also, a non-conductive coating or the like may be applied over the portion of power pads 222 and 224 that is under power module 206.

Power pads 226 and 228 are used to electrically couple power rails 216A and 216B to selected pads from among IC pads 220B. For example, in one embodiment, power pad 226 is connected to a set of supply voltage IC pads for processor 214B, while power pad 228 is connected to a set of ground IC pads for processor 214B. Power pads 230 and 232 are used to electrically couple power rails 216A and 216B to selected pads from among IC pads 220A in a similar manner.

In the power pad routing schemes of FIGS. 2c and 2d, power pads 226, 228, 230, and 232 are shown on the top layer of PCB 202. However, this is merely one exemplary configuration. In general, power pad routing may employ use of internal layers, as well as appropriate vias, as is well-understood in the art.

In order to route power via power rails 216A and 216B, there need to be a mechanism for adequately coupling the power rails to power pads 222, 224, 226, 228, 230, and 232. In one embodiment, power rails 216A and 216B are coupled to PCB 202 using various types of fasteners, such as machine screws, shoulder screws, etc, wherein the shanks of the fasteners pass through the PCB and thread into the power rails. An exemplary mounting scheme of this type, using fasteners 340, is shown in FIG. 3a. In another embodiment, solder is used to electrically (and mechanically) couple the power rails to the PCB using an appropriate soldering technique, such as wave-soldering. As yet another option, a power rail may be coupled to the power pad(s) using a conductive epoxy. In still another embodiment, a combination of the foregoing schemes may be employed, such as using a combination of fasteners and soldering, for example.

In one embodiment, a power pad having a configuration similar to the planer profile of a power rail is formed on the top layer of PCB 202, such as shown in FIG. 2d. This configuration is analogous to that shown in FIG. 2c, except for the addition of elongated power pads 234 and 236. It is recommended that solder not be applied along the entire length of elongated power pads 234 and 236, since there is a coefficient of expansion mismatch between the layer substrate of PCB 202 (e.g., fiberglass) and the material used for power rails 214A and 214B, which are typically made of a metal with good conduction, such as aluminum, copper, or various well-known alloys. This coefficient of expansion mismatch may lead to fatigue failure of the solder joints.

Another aspect of the power rails employed in the embodiment of FIGS. 2a–f, and 3a–b is the ability to function as a heat sink rail. For example, in the embodiment of FIG. 3a, each of power rails 216A and 216B has a profile including one or more slots 300n (e.g., $300_1$ and $300_2$ for a two-slot configuration) defined in an inward-facing edge of the profile. In the illustrated embodiment of FIG. 3a, an optional second set of slots $301_1$ and $301_2$ are formed in the outward facing edge of power rails 216A and 216B, as well. These second sets of slots are used to enhance cooling of the power rails via forced or natural convection.

The slots in the power rails are configured to slidingly engage a corresponding flange 302 defined in a heatsink 304. As shown in the assembly process of FIGS. 2a and 2b, as each of heatsinks 304A and 304B is placed over a respective processor 214A and 214B, the flanges of the heatsinks slide within respective slots 300n in power rails 216A and 216B. The slots to be employed are dependent on the height of the top surface of an installed processor. Thus, a power rail with multiple slots provides support for processor installations having multiple different heights.

In general, it will be desired to securely hold heatsinks 304A and 304B in place upon installation, while thermally coupling the heatsinks to their respective processor. This may be performed by one of several different schemes, such as, but not limited to, employing fasteners, wedge blocks, spring clips, etc. The securing mechanism may also be used to adjust the height of the base of a heatsink relative to the top surface of a processor. At the same time, it is desired to thermally couple heatsink 304 to either (substantially) all of the upper surface of processor 214, or at least the area proximate to the die area of the processor. This can be done using several techniques, including employing a thermal paste 306.

Another consideration relates to electrical isolation of the power rails. In some embodiments, power having different voltage levels is supplied to power rails 216A and 216B, such as processor core power (e.g., 2.0 volts) supplied to one power rail while employing the other power rails as a ground. Since heatsinks are typically made of conductive materials, such as aluminum, mechanically coupling a heatsink across the two power rails will cause a short. This is highly undesirable.

This consideration may be addressed in one of several fashions. In the embodiment illustrated in FIG. 3a, a thermally conductive, yet non-electrically-conductive, coating 308 is applied to one or both of slots 300n and heatsink flanges 302. For example, there are various coatings that are both thermally conductive and good electrical insulators, such as thermally-conductive paints and ceramics.

In accordance with another technique for enhancing the cooling of processors 214A and 214B, either or both of power rails 216A and 216B may employ a heat pipe 310. A typical heat pipe consists of a sealed metal container housing a capillary wicking material and a working fluid. A heat pipe provides the ability to transport heat against gravity by employing an evaporation-condensation cycle with the help of porous capillaries that form the wick. The wick provides the capillary driving force to return the condensate to the evaporator section of the heat pipe. The quality and type of wick usually determines the performance of the heat pipe. Different types of wicks are used depending on the application for which the heat pipe is being used.

The working fluid is used to transfer heat via fluid transport in combination with an evaporation/condensation cycle. Thus, a first consideration in the identification of a suitable working fluid is the operating vapor temperature range. Within the approximate temperature band, several possible working fluids may exist, and a variety of characteristics, should be examined in order to determine the most acceptable of these fluids for the application considered. The selection of the working fluid should also be based on thermodynamic considerations which are concerned with the various limitations to heat flow occurring within the heat pipe, such as viscous, sonic, capillary, entrainment and nucleate boiling levels.

In heat pipe design, a high value of surface tension is desirable in order to enable the heat pipe to operate against gravity and to generate a high capillary driving force. In addition to high surface tension, it is necessary for the working fluid to wet the wick and the container material—i.e., the contact angle should be zero or very small. The vapor pressure over the operating temperature range must be sufficiently great to avoid high vapor velocities, which tend to set up large temperature gradients and cause flow instabilities.

A high latent heat of vaporization is desirable in order to transfer large amounts of heat with minimum fluid flow, and hence to maintain low pressure drops within the heat pipe. The thermal conductivity of the working fluid should preferably be high in order to minimize the radial temperature gradient and to reduce the possibility of nucleate boiling at the wick or wall surface. The resistance to fluid flow will be minimized by choosing fluids with low values of vapor and liquid viscosities.

The prime purpose of the wick is to generate capillary pressure to transport the working fluid from the condenser to the evaporator. It must also be able to distribute the liquid around the evaporator section to any area where heat is likely to be received by the heat pipe. Often these two functions require wicks of different forms. The selection of the wick for a heat pipe depends on many factors, several of which are closely linked to the properties of the working fluid.

The wicking material is a porous structure made of materials such as steel, aluminum, nickel or copper in various ranges of pore sizes. These structures are typically fabricated using metal foams and felts (most common). By varying the pressure on the felt during assembly, various pore sizes can be produced. By incorporating removable metal mandrels, an arterial structure can also be molded in the felt. The most common types of wicks are sintered powders, grooved tubes, and screen meshes.

Fibrous materials, like ceramics, may also be used. These materials generally have smaller pores. The main disadvantage of ceramic fibers is that they have little stiffness and usually require a continuous support by a metal mesh. Thus while the fiber itself may be chemically compatible with the working fluids, the supporting materials may cause problems. More recently, interest has turned to carbon fibers as a wick material. Carbon fiber filaments have many fine longitudinal grooves on their surface, have high capillary pressures and are chemically stable.

The maximum capillary head generated by a wick increases with decrease in pore size. The wick permeability increases with increasing pore size. Another feature of the wick, which must be optimized, is its thickness. The heat transport capability of the heat pipe is raised by increasing the wick thickness. The overall thermal resistance at the evaporator also depends on the conductivity of the working fluid in the wick. Other necessary properties of the wick are compatibility with the working fluid and wettability.

A heat pipe operates in the following manner. Inside the sealed container is a liquid under its own pressure, which enters the pores of the capillary material, wetting all internal surfaces. Applying heat at any point along the surface of the heat pipe causes liquid working fluid at that point to boil and enter a vapor state. When that happens, the working fluid picks up the latent heat of vaporization. The gas, which then has a higher pressure, moves inside the sealed container to a colder location where it condenses. Thus, the gas gives up the latent heat of vaporization and moves heat from the input (at which a heat source is located) to the output end of the heat pipe. In the embodiments of FIGS. 2a–f, the output end is disposed toward the top of the Figures.

Returning to FIG. 3a, supporting a heat pipe in a power rail can be enabled in the following manner. First, a cavity is formed in a power rail. In the illustrated embodiment of FIG. 3a, the cavity has a circular cross-section, which may be formed using one of several techniques, such as extruding a power rail. Optionally, the cavity may be formed by machining or casting. Furthermore, the internal profile of the cavity is generally not important.

Next, an appropriate wicking material is inserted into the cavity. As discussed above, various types of wicking material may be used. In one embodiment, a sintered metal cast in the shape of the power rail cavity is used. In cases in which an extruded profile is used, each end of the profile needs to be sealed. When machining or casting is employed, only one end of the profile may need to be sealed (the other is inherently sealed by the power rail material) in some instances. Generally, it will be preferred that one end be sealed, while the other remains unsealed before inserting the wicking material.

Either before or after the wicking material is inserted into the cavity, the working fluid is added. It is important that the working fluid not completely fill the cavity, as this will prevent proper operation of the evaporation/condensation cycle. Additionally, the working fluid should be selected based on the expected operating temperature range for the heat pipe. After the wicking material and working fluid is added, the cavity is sealed to enclose the working fluid and wicking material. Typically, this can be accomplished by covering an open end of the power rail with a thin material, such as a metal. Various types of sealing techniques may be employed for this purpose, such as soldering, brazing, using epoxy, etc. The net objective is to hermetically seal both ends of the power rail, thus preventing the working fluid from escaping.

Figure 3B:
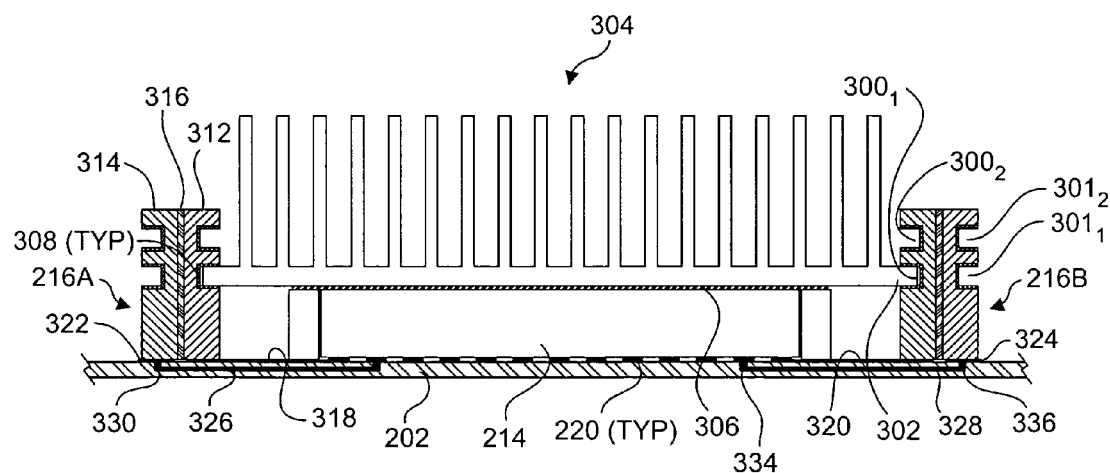
FIG. 3b is a cross-sectional view taken along line 3a—3a of FIG. 2b, illustrating further details of first and second power rails having a split-rail configuration, according to one embodiment of the invention.

In addition to supplying a single voltage level to various circuitry, an individual power rail may be employed to supply multiple voltage levels. For example, a split-rail embodiment for a power rail is shown in FIG. 3b. Under this embodiment, one or both of power rails 216A and 216B (both shown here) have a "split" configuration. The split terminology refers to two conductive sections 312 and 314 being divided (split) by an insulator section 316. These three sections may be joined by using a suitable assembly technique. In one embodiment, conductive sections 312 and 314 are simply joined using a suitable non-conductive adhesive comprising insulator section 316.

In addition to the two conductive sections shown in FIG. 3b, additional conductive sections may be employed. Under such embodiments, each adjacent pair of conductive sections will be separated by an insulator section. It is noted that the material used for an insulator section does not have to occupy the entire gap between the two conductive sections. For example, a portion of the gap may be occupied by air.

In general, power from the different conduction sections will be routed to selected IC pads 220 via different layers in PCB 202 (although the same layer may be used). Under these circumstances, appropriate power traces and vias will be employed. For illustrative purposes, an exemplary routing scheme employing power pads 318, 320, 322, and 324 along with power traces 326 and 328 and vias 330, 332, 334, and 336 is shown in FIG. 3b.

In one embodiment, the supply voltages (or ground) supplied to the inner conductive sections 312 are the same. Accordingly, upon energizing power rails, there is no voltage differential across the heatsinks 304A and 304B. Thus, there is no need for thermally conductive coating 308 in this embodiment.

As shown in FIGS. 2e and 2f, the heatsinks used in an actual implementation may extend over more than just corresponding high-power ICs, such as processors 214A and 214B. For example, the scheme of FIG. 2e employs a heatsink 304C disposed toward the top ends of power rails 216A and 216B. A heatsink in this location may be advantageous for use in embodiments employing heatpipes. Under the scheme of FIG. 2f, a single elongated heatsink 304D runs substantially the length of power rails 216A and 216B.

Using computer-based heat transfer modeling, embodiments configured in accordance with the principles and techniques disclosed herein have been shown to dramatically enhance cooling. For example, one model shows a 40% reduction in package temperature for the embodiment of FIGS. 2a and 2b, when compared with a similar configuration that includes heatsinks analogous to heatsinks 304A and 304B but does not employ power rails 216A and 216B.

As discussed above, using power rails also saves significant routing real estate. For example, using a conventional PCB structure requires a power trace width of approximately 1.5 inches to supply 100 A of current (the amount of current corresponding to a 200 W consumption by components running at 2.0 V core voltages). Thus, since power traces of this size are required both for the supply voltage and ground, approximately 3 inches of board real estate, running the entire length of a board, would be required. In contrast, in one embodiment power rails 216A and 216B are approximately 0.25 inches in width, thus requiring about one-half inch of board real estate for two rails.

In addition to the foregoing power distribution and cooling functions, power rails also serve a board-stiffening function. The schemes disclosed herein enable a designer to randomly locate one or more heatsinks to cool one or more components of varying heights. Furthermore, the power rail configuration also minimizes the number of holes in a PCB required to fasten heatsinks.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a printed circuit board (PCB), including,
at least one set of integrated circuit (IC) pads, each set of IC pads to electrically couple one of an IC or a socket configured to receive an IC to the PCB; and
a set of power supply pads to electrically couple one of a power module, power supply circuitry, or connector configured to receive a power module to the PCB; and
first and second power rails, each mounted to the PCB and electrically coupled to a portion of the power supply pads and a portion of said at least one set of IC pads, wherein the first and second power rails are spaced apart and disposed on opposite sides of said at least one set of IC pads and each power rail has a slotted profile including at least one slot configured to receive a flange on a heatsink.

2. The apparatus of claim 1, further comprising:
a first IC, coupled to a first set of IC pads; and
a first heatsink, having a flange slidingly engaged with a respective slot in each of the first and second power rails.

3. The apparatus of claim 2, further comprising:
means for thermally coupling the first heatsink to the first IC.

4. The apparatus of claim 2, wherein the first and second power rails are to carry different voltages, and the apparatus further comprises:
means for electrically isolating the first heatsink from at least one of the first and second power rails while thermally coupling the first heatsink to said at least one of the first and second power rails.

5. The apparatus of claim 4, wherein said means for electrically isolating the first heatsink from at least one of the first and second power rails comprises a thermally conductive non-electrically conductive coating applied to at least one of an area proximate to a slot in at least one of the first and second power rails and to an area proximate to the flanges of the first heatsink.

6. The apparatus of claim 1, further comprising:
a second IC, coupled to a second set of IC pads; and
a second heatsink, having a flange slidingly engaged with a respective slot in each of the first and second power rails.

7. The apparatus of claim 1, further comprising:
a first IC socket, coupled to a first set of IC pads;
a first IC, coupled to the first IC socket; and
a first heatsink, having a flange slidingly engaged with a respective slot in each of the first and second power rails.

8. The apparatus of claim 7, further comprising:
a second IC socket, coupled to a second set of IC pads;
a second IC, coupled to the second IC socket; and
a second heatsink, having a flange slidingly engaged with a respective slot in each of the first and second power rails.

9. The apparatus of claim 8, further comprising a third heatsink disposed toward a top end of the power rails and having a flange slidingly engaged with a respective slot in each of the first and second power rails.

10. The apparatus of claim 1, wherein each of the first and second power rails has a profile including a plurality of slots disposed at different heights relative to a base of the profile.

11. The apparatus of claim 1, wherein at least one of the first and second power rails includes an embedded heat pipe, including a cavity in which a wicking material and working fluid is disposed.

12. The apparatus of claim 1, further comprising a pair of elongated pads formed on a top layer of the PCB, wherein a base of each of the first and second power rails is electrically-coupled to a respective elongated pad.

13. The apparatus of claim 1, further comprising power supply circuitry coupled to the PCB via the set of power supply pads.

14. The apparatus of claim 1, further comprising a power module connector coupled to the PCB via the set of power supply pads.

15. The apparatus of claim 1, wherein the apparatus comprises one of a telecommunications equipment board or computer equipment board.

16. The apparatus of claim 1, wherein at least one of the first and second power rails comprises a split power rail including first and second conductive sections separated by an insulator section.

17. The apparatus of claim 1, further comprising an elongated heat sink running substantially the length of the first and second power rails and having flanges on opposing sides slidingly engaging respective slots in the first and second power rails.

18. An apparatus, comprising:
a printed circuit board (PCB), including,
power supply means;
a first integrated circuit (IC); and
first and second power rails, spaced apart and disposed on opposite sides of the first integrated circuit, each power rail having a slotted profile including at least one slot configured to receive a flange on a heatsink;
means for electrically coupling power outputs from the power supply means to each of the first and second power rails;
means for electrically coupling each of the first and second power rails to the first IC; and
means for coupling the first and second power rails to the PCB.

19. The apparatus of claim 18, further comprising:
a first heatsink having flanges on opposing sides, wherein the flanges slidingly engage respective slots defined in each of the first and second power rails such that the first heatsink is disposed proximate to the first IC; and
means for securing the first heatsink to the first and second power rails.

20. The apparatus of claim 19, further comprising:
means for thermally coupling the first IC to the first heatsink.

21. The apparatus of claim 19, further comprising:
means for thermally coupling at least one of the first and second power rails to the first heatsink while electrically insulating said at least one of the first and second power rails from the first heatsink.

22. The apparatus of claim 19, further comprising:
- a second IC, disposed between the first and second power rails;
- a second heatsink, having flanges on opposing sides slidingly engaging the respective slots defined in the first and second power rails and disposed proximate to the second IC; and
- means for securing the second heatsink to the first and second power rails.

23. The apparatus of claim 18, wherein at least one of the first and second power rails comprises a split power rail including first and second conductive sections separated by an insulator section, the apparatus further comprising:
- means for electrically coupling power outputs from the power supply means to each of the first and second conductive sections of each split power rail;
- means for electrically coupling each of the first and second conductive sections of each split power rail to the first IC.

24. A method, comprising:
- routing power to a first integrated circuit (IC) on a printed circuit board (PCB) via first and second power rails coupled to the PCB, the first and second power rails being spaced apart and disposed on opposite sides of the first IC; and
- thermally coupling a first heatsink to the first IC by slidingly engaging flanges on opposing sides of the first heatsink with respective slots defined in the first and second power rails.

25. The method of claim 24, further comprising:
- routing power to a second integrated circuit (IC) on the PCB via the first and second power rails; and
- thermally coupling one of the first heatsink or a second heatsink to the second IC by slidingly engaging flanges on opposing sides of the first heatsink or second heatsink with slots defined in the first and second power rails.

26. The method of claim 24, further comprising:
- providing power having different voltage levels to the first IC via the first and second power rails; and
- electrically insulating at least one of the first and second power rails from the first heatsink while thermally coupling said one of the first and second power rails to the first heatsink.

27. The method of claim 24, further comprising:
- configuring at least one of the first and second power rails to operate as a heat pipe.

28. The method of claim 24, further comprising:
- routing a first power output provided by a power supply coupled to the PCB to the first power rail; and
- routing a second power output provided by the power supply to the second power rail.

29. The method of claim 28, wherein the first power output is a supply voltage to the IC and the second power output comprises a ground.

* * * * *